(12) United States Patent
Uchida

(10) Patent No.: US 9,177,684 B2
(45) Date of Patent: Nov. 3, 2015

(54) LIGHT IRRADIATION APPARATUS AND PRINTING APPARATUS

(71) Applicant: KYOCERA Corporation, Kyoto-shi, Kyoto (JP)

(72) Inventor: Shinya Uchida, Kyoto (JP)

(73) Assignee: KYOCERA CORPORATION, Kyoto-Shi, Kyoto (JP)

( * ) Notice: Subject to any disclaimer, the term of this patent is extended or adjusted under 35 U.S.C. 154(b) by 0 days.

(21) Appl. No.: 14/368,622

(22) PCT Filed: Dec. 26, 2012

(86) PCT No.: PCT/JP2012/083648
§ 371 (c)(1),
(2) Date: Jun. 25, 2014

(87) PCT Pub. No.: WO2013/099941
PCT Pub. Date: Jul. 4, 2013

(65) Prior Publication Data
US 2014/0375735 A1 Dec. 25, 2014

(30) Foreign Application Priority Data
Dec. 27, 2011 (JP) .................. 2011-284597

(51) Int. Cl.
| | |
|---|---|
| *B41J 11/00* | (2006.01) |
| *G21K 5/02* | (2006.01) |
| *G21K 5/10* | (2006.01) |
| *B41J 2/01* | (2006.01) |
| *B41F 23/04* | (2006.01) |

(Continued)

(52) U.S. Cl.
CPC . *G21K 5/02* (2013.01); *B41F 23/04* (2013.01); *B41J 2/01* (2013.01); *B41J 11/002* (2013.01); *G21K 5/10* (2013.01); *B29C 71/04* (2013.01); *B29C 2035/0827* (2013.01); *B29C 2035/0833* (2013.01)

(58) Field of Classification Search
CPC .............................. B41J 11/002; B41J 11/007
USPC ........................................ 347/102; 399/92, 93
See application file for complete search history.

(56) References Cited

U.S. PATENT DOCUMENTS 3,628,987 A * 12/1971 Nakata et al. .................. 428/353
4,252,413 A *  2/1981 Nablo ............................ 250/310

(Continued)

FOREIGN PATENT DOCUMENTS

| JP | 2008-162153 A | 7/2008 |
| JP | 2008-244165 A | 10/2008 |
| JP | 2011-143626 A | 7/2011 |

OTHER PUBLICATIONS

International Search Report, PCT/JP2012/083648, Mar. 5, 2013, 1 pg.

*Primary Examiner* — Stephen Meier
*Assistant Examiner* — John P Zimmermann
(74) *Attorney, Agent, or Firm* — Volpe and Koenig, P.C.

(57) ABSTRACT

A light irradiation apparatus of the embodiment is a light irradiation apparatus that emits light including an ultraviolet ray to a target relatively moving in one direction, including a light irradiation device in which a light emitting element is disposed on one main surface of a base; and a light irradiation chamber in whose internal space the target moves with a light-irradiated surface up from an entrance to an exit thereof in the one direction, the light irradiation device being disposed in an upper section of the internal space.

10 Claims, 5 Drawing Sheets

(51) Int. Cl.
*B29C 71/04* (2006.01)
*B29C 35/08* (2006.01)

(56) References Cited

U.S. PATENT DOCUMENTS

| | | | |
|---|---|---|---|
| 5,031,002 A * | 7/1991 | Yaguchi | 399/400 |
| 5,060,009 A * | 10/1991 | Milovanovich | 355/27 |
| 6,397,488 B1 * | 6/2002 | Brinkly | 34/92 |
| 6,463,674 B1 * | 10/2002 | Meyers et al. | 34/304 |
| 6,775,492 B2 * | 8/2004 | Miyakoshi et al. | 399/92 |
| 7,391,987 B2 * | 6/2008 | Sahara | 399/92 |
| 2004/0037582 A1 * | 2/2004 | Shin | 399/93 |
| 2006/0055757 A1 * | 3/2006 | Yamashita et al. | 347/102 |
| 2006/0146109 A1 * | 7/2006 | Goodyer | 347/102 |
| 2008/0128739 A1 | 6/2008 | Sanpei et al. | |
| 2010/0188852 A1 | 7/2010 | Sanpei et al. | |
| 2011/0182073 A1 | 7/2011 | Sanpei et al. | |
| 2012/0201028 A1 | 8/2012 | Sanpei et al. | |

\* cited by examiner (a)

MOVEMENT DIRECTION (b)

MOVEMENT DIRECTION

MOVEMENT DIRECTION

LIGHT IRRADIATION APPARATUS AND PRINTING APPARATUS

TECHNICAL FIELD

The present invention relates to a light irradiation apparatus used in curing ultraviolet ray curable resin or paint, and a printing apparatus using the same.

BACKGROUND ART

In the related art, an ultraviolet ray irradiation apparatus is widely used for fluorescence reaction observation, sterilization purposes in the field of medical care or biotechnology, electronic component adhesion, or curing of ultraviolet ray curable resin and ink. In particular, as a lamp light source of the ultraviolet ray irradiation apparatus used in curing the ultraviolet ray curable resin for use in adhering small components in the field of electronic components, the ultraviolet ray curable ink for use in the field of printing or the like, a high pressure mercury lamp, a metal halide lamp, or the like is used.

In recent years, there has been a strong worldwide demand for a reduced burden on the global environment. Therefore, an ultraviolet ray irradiation element which has relatively long durability and energy-saving performance, and which can suppress ozone generation has been actively employed in the lamp light source.

However, the ultraviolet ray irradiation element has relatively low intensity of illumination. Therefore, for example, as disclosed in Japanese Unexamined Patent Publication JP-A 2008-244165, a light irradiation apparatus is generally used which has a configuration where plural devices are mounted on a support by preparing a device in which plural light emitting elements are mounted on one substrate. In this manner, ultraviolet ray irradiation energy needed to cure the ultraviolet ray curable ink is obtained.

However, depending on the service environment of the ultraviolet ray irradiation apparatus, and types of the ultraviolet ray curable ink and a target (recording medium) for applying the ultraviolet ray curable ink, there is a problem in that it is difficult to increase adhesion between the ultraviolet ray curable ink and the target.

The invention is made in view of the above-described problem, and an object thereof is to provide a light irradiation apparatus and a printing apparatus which achieve increased adhesion between an ultraviolet ray curable ink and a target regardless of the service environment of an ultraviolet ray irradiation apparatus, and types of the ultraviolet ray curable ink and the target for applying the ultraviolet ray curable ink.

SUMMARY OF INVENTION

A light irradiation apparatus of the invention that emits light including an ultraviolet ray to a target relatively moving in one direction includes a light irradiation device in which a light emitting element is disposed on one main surface of a base, and a light irradiation chamber in whose internal space the target moves with a light-irradiated surface up from an entrance to an exit thereof in the one direction, the light irradiation device being disposed in an upper section of the internal space.

DESCRIPTION OF EMBODIMENTS

Hereinafter, embodiments of a light irradiation apparatus and a printing apparatus of the invention will be described with reference to the drawings. The embodiments of the invention are simply exemplified in the following description, and the invention is not limited to these embodiments.

(Light Irradiation Apparatus)

Figure 1:
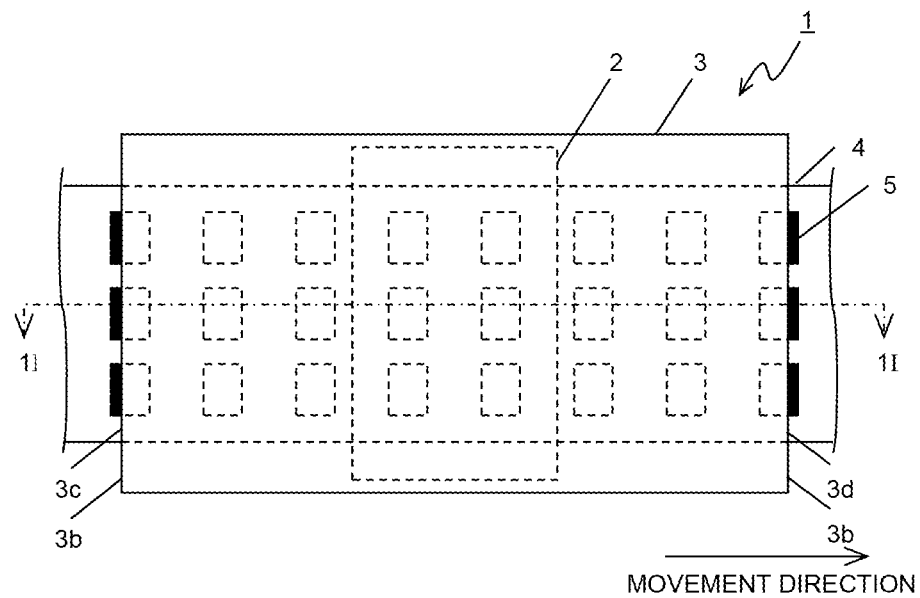
FIG. 1(a) is a top view illustrating an example of an embodiment of a light irradiation apparatus of the invention.
FIG. 1(b) is a cross-sectional view along the line 1I-1I in FIG. 1(a)
Figure 1:
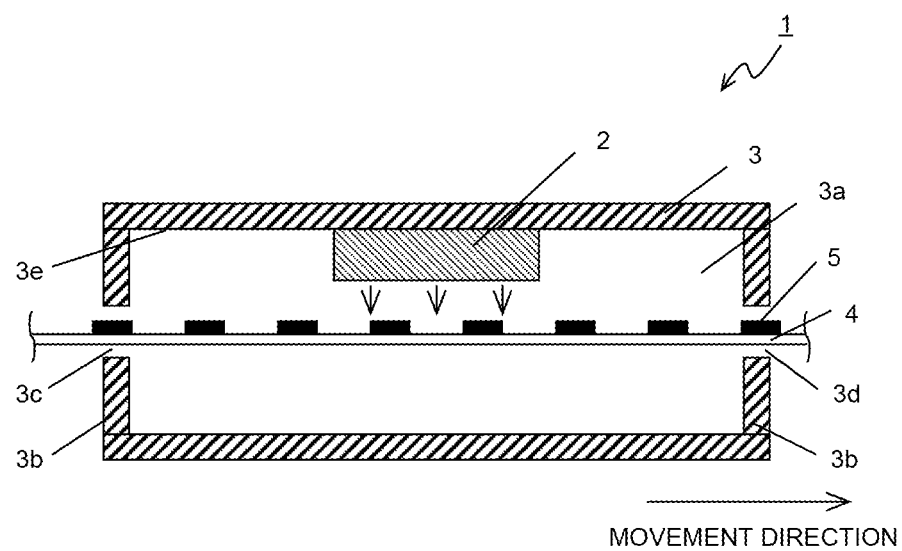

A light irradiation apparatus 1 illustrated in FIG. 1 is assembled to a printing apparatus such as an offset printing apparatus or an ink jet printing apparatus which uses an ultraviolet ray curable ink 5, and functions as an ultraviolet ray curing apparatus which cures the ultraviolet ray curable ink 5 by emitting an ultraviolet ray after applying the ultraviolet ray curable ink 5 to a target 4 (hereinafter, referred to as a recording medium).

The light irradiation apparatus 1 includes a light irradiation device 2 and a light irradiation chamber 3, and the light irradiation device 2 is disposed in an upper section in an internal space 3a of the light irradiation chamber 3.

(Light Irradiation Device)

First, the light irradiation device 2 will be described.

Figure 2:
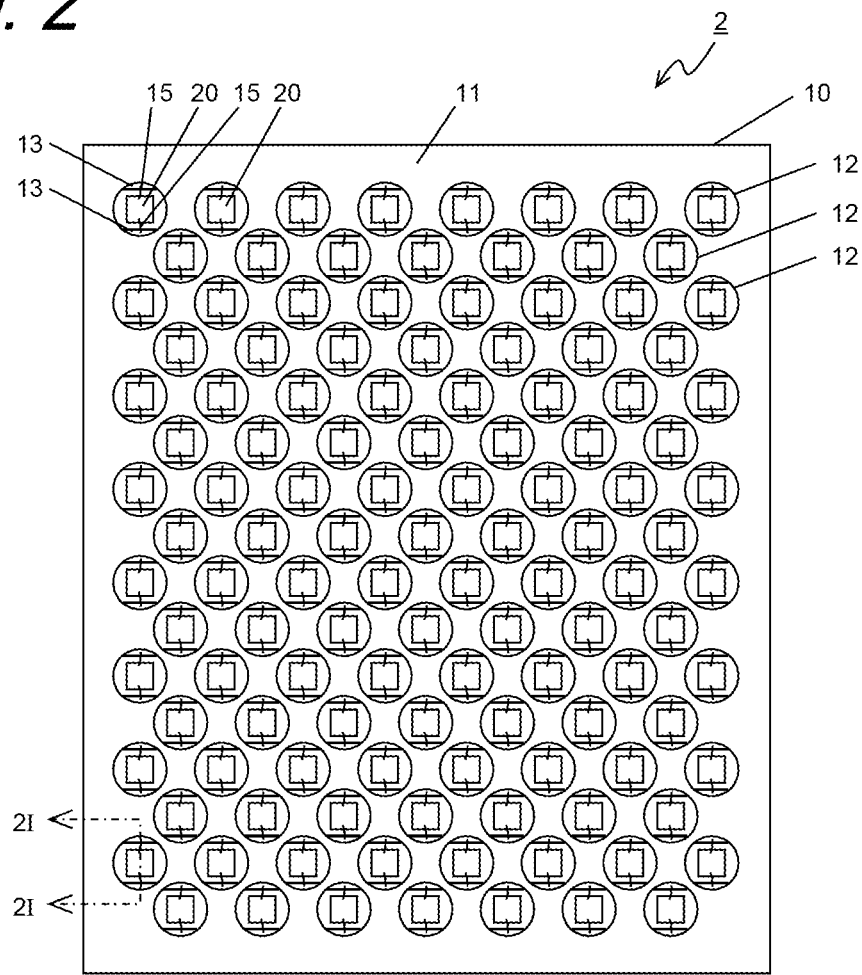
FIG. 2 is a plan view of a light irradiation device configuring the light irradiation apparatus illustrated in FIG. 1.
Figure 3:
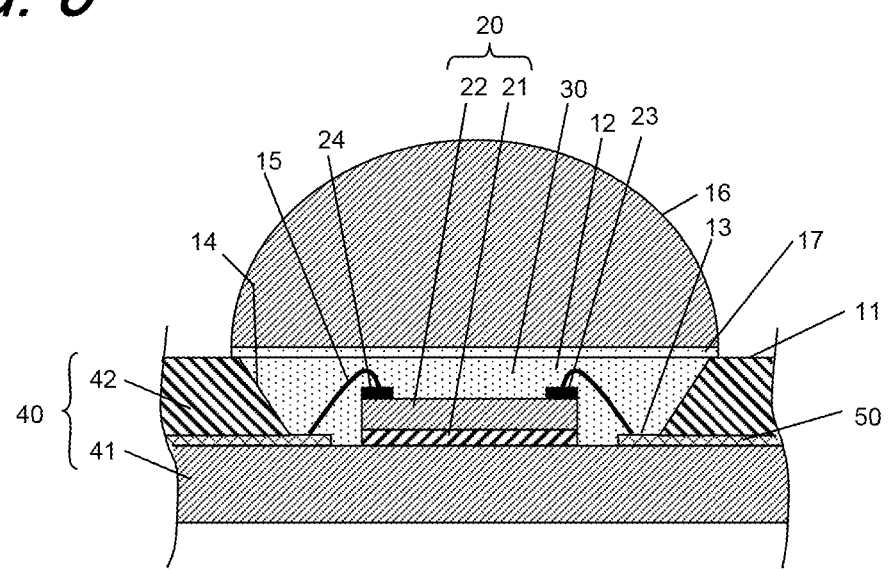
FIG. 3 is a cross-sectional view taken along the line 2I-2I illustrated in FIG. 2.

The light irradiation device 2 illustrated in FIGS. 2 and 3 includes a base 10 having plural opening portions 12 on one main surface 11 thereof, plural connection pads 13 disposed inside the respective opening portions 12, plural light emitting elements 20 disposed inside the respective opening portions 12 of the base 10 and electrically connected to the connection pads 13, plural sealing materials 30 internally filling the respective opening portions 12 and coating the light emitting elements 20, and optical lenses 16 corresponding to the respective opening portions 12.

The base 10 includes a stacked body 40 in which a first insulation layer 41 and a second insulation layer 42 are stacked on one another, and an electric wire 50 which connects the light emitting elements 20 to each other. The base 10 has a rectangular shape when seen from the one main surface 11 side in a plan view, and supports the light emitting element 20 inside the opening portion 12 disposed on the one main surface 11.

For example, the first insulation layer 41 is formed of ceramics such as an aluminum oxide sintered body, an aluminum nitride sintered body, a mullite sintered body, and glass ceramics, and resins such as epoxy resin and a liquid crystal polymer (LCP).

For example, the electric wire 50 is formed of a conductive material such as tungsten (W), molybdenum (Mo), manganese (Mn), and copper (Cu) so as to have a predetermined pattern, and functions as a power supply wire for supplying a current to the light emitting element 20 or a current from the light emitting element 20.

The opening portion 12 penetrating the second insulation layer 42 is formed in the second insulation layer 42 stacked on the first insulation layer 41.

In the opening portions 12, an inner peripheral surface 14 thereof is tiled so that the one main surface 11 side of the base 10 has a hole diameter larger than that of a placement surface of the light emitting element 20, and each shape of the opening portions 12 is a circular shape, for example, in a plan view. The opening shape is not limited to the circular shape, and may be a rectangular shape.

This opening portion 12 has a function of causing the light emitted from the light emitting element 20 to be reflected upward by using the inner peripheral surface 14, and for improving efficiency in light extraction.

In order to improve the efficiency in light extraction, as a material of the second insulation layer 42, it is preferable to form the second insulation layer 42 by using a porous ceramic material having relatively good reflective properties with respect to the light in an ultraviolet ray region, for example, such as an aluminum oxide sintered body, a zirconium oxide sintered body, and an aluminum nitride sintered body. In addition, from a viewpoint of improving the efficiency in light extraction, a metallic reflecting film may be disposed on the inner peripheral surface 14 of the opening portion 12.

These opening portions 12 are vertically and horizontally arrayed over the entire one main surface 11 of the base 10. For example, the opening portions 12 are arrayed in a staggered manner, that is, the opening portions 12 are disposed in a zigzag array having plural rows. This array enables the light emitting elements 20 to be disposed more densely, and can increase intensity of illumination per unit area. Here, the zigzag array means that the opening portions 12 are arranged so as to be located at a grid point of a slanted grid.

When the intensity of illumination per unit area can be sufficiently ensured, the opening portions 12 may be arrayed in a positive grid shape. It is not necessary to limit the array shape.

The above-described base 10 including the stacked body 40 configured to have the first insulation layer 41 and the second insulation layer 42 is manufactured through the following processes, in the case where the first insulation layer 41 and the second insulation layer 42 are formed of ceramics.

First, plural ceramic green sheets manufactured by a conventionally known method are prepared. Holes corresponding to the opening portions are formed in the ceramic green sheets equivalent to the opening portions 12 by means of a method such as punching. Next, a metal paste serving as the electric wire 50 is printed (not illustrated) on the green sheets. Thereafter, the green sheets are stacked on one another so that the printed metal paste is located between the green sheets. The metal paste serving as the electric wire 50 includes those which contain metal, such as tungsten (W), molybdenum (Mo), manganese (Mn), and copper (Cu), for example. Then, the above-described stacked body is sintered. In this manner, it is possible to form the base 10 having the electric wire 50 and the opening portions 12 by sintering the green sheets together with the metal paste.

In addition, in the case where the first insulation layer 41 or the second insulation layer 42 is formed of a resin, it is considered that the manufacturing method of the base 10 may employ the following method, for example.

First, precursor sheets of a thermosetting resin are prepared. Then, a lead terminal formed of a metallic material serving as the electric wire 50 is disposed between the precursor sheets, and the plural precursor sheets are stacked on one another so that the lead terminal is embedded in the precursor sheets. For example, a forming material of the lead terminal includes metallic materials such as copper (Cu), silver (Ag), aluminum (Al), steel (Fe)-nickel (Ni)-cobalt (Co) alloy, and iron (Fe)-nickel (Ni) alloy. Then, holes corresponding to the opening portions 12 are formed on the precursor sheet by means of a method such as laser processing or etching. Thereafter, this precursor sheets are subjected to thermal curing. In this manner, the base 10 is completely manufactured. When through-holes corresponding to the opening portions 12 are formed by means of the laser processing, the through-holes may be formed after the thermal curing of the precursor sheets.

On the other hand, the connection pad 13 electrically connected to the light emitting element 20, the light emitting element 20 connected to the connection pad 13 by a bonding material 15 such as solder, a gold (Au) wire and an aluminum (Al) wire, and the sealing material 30 sealing the light emitting element 20 are disposed inside the opening portion 12 of the base 10.

For example, the connection pad 13 is formed of a metallic layer made of a metallic material such as tungsten (W), molybdenum (Mo), manganese (Mn), and copper (Cu). If necessary, a nickel (Ni) layer, a palladium (Pd) layer, and a gold (Au) layer may be further stacked on the metallic layer. The connection pad 13 is connected to the light emitting element 20 by the bonding material 15 such as the solder, the gold (Au) wire, and the aluminum (Al) wire.

In addition, for example, the light emitting element 20 is configured by a light emitting diode formed by stacking a p-type semiconductor layer an n-type semiconductor layer formed of a gallium arsenic (GaAs) semiconductor material or a gallium nitride (GaN) semiconductor material on an element substrate 21 such as a sapphire substrate, or an organic EL device whose semiconductor conductive layer is formed of an organic material.

This light emitting element 20 includes a semiconductor layer 22 having a light emitting layer, and element electrodes 23 and 24 formed of a metallic material such as gold (Au) which are connected to the connection pad 13 disposed on the base 10 via the boding material 15 such as the solder, the gold (Au) wire, and the aluminum (Al) wire. The light emitting element 20 is connected to the base 10 by wire bonding. Then, the light emitting element 20 emits light having a predetermined wavelength with predetermined brightness in response to a current flowing between the element electrodes 23 and 24, and emits the light outward via the element substrate 21. As is known, it is possible to omit the element substrate 21. In addition, the element electrodes 23 and 24 of the light emitting element 20 may be connected to the connection pad 13 by using a conventionally known flip connection technology in which the solder is used as the bonding material 15.

The present embodiment employs an LED which emits UV light in which a peak of a wavelength spectrum of the light emitted by the light emitting element 20 is 250 to 395 [nm] or less, for example. That is, the present embodiment employs a UV-LED element as the light emitting element 20. The light emitting element 20 is formed by a conventionally known thin film forming technology.

Then, the light emitting element 20 is sealed with the above-described sealing material 30.

The sealing material 30 is formed of an insulation material such as a light transmitting resin material. The sealing material 30 excellently seals the light emitting element 20, thereby preventing moisture permeating from outside or absorbing an impact from outside. In this manner, the light emitting element 20 is protected.

In addition, the sealing material 30 is formed of a material having a refractive index between a refractive index (in a case of sapphire: 1.7) of the element substrate 21 configuring the light emitting element 20 and a refractive index of the air (approximately 1.0), for example, a silicone resin (refractive index: approximately 1.4). In this manner, it is possible to improve the efficiency of light extraction of the light emitting element 20.

The sealing material 30 is formed by filling the opening portion 12 with the precursor such as the silicone resin and curing the precursor after the light emitting element 20 is mounted on the base 10.

Then, the optical lens 16 is disposed so as to cover the light emitting element 20 on the above-described sealing material 30 via a lens adhesive 17. The light irradiation device 2 of the present embodiment employs a plano-convex lens as the optical lens 16. That is, the optical lens 16 of the present embodiment is configured so that one main surface has a convex shape and the other main surface has a planar surface shape. A cross-sectional area thereof decreases from the other main surface toward the one main surface.

For example, the optical lens 16 is formed of silicone and has a function of collecting the light emitted from the light emitting element 20. In addition to the above-described silicone resin, a material of the optical lens includes a thermosetting resin such as a urethane resin and an epoxy resin, plastics made of a thermo-plastic resin such as a polycarbonate resin and an acrylic resin, sapphire, or inorganic glass. In the case where it is not necessary to collect the light, such as when a distance is close between the light irradiation device 2 and the target 4, it is possible to omit the optical lens 16.

As described above, the light irradiation device 2 of the present embodiment is of a surface light emitting type in which the plural light emitting elements 20 are vertically and horizontally arrayed over the entire one main surface 11 of the base 10. However, the light irradiation device 2 may be of a line light emitting type in which the plural light emitting elements 20 are arrayed on the one main surface 11 of the base 10 in one row, and the light emitting element 20 may be configured to be single. In addition, the light irradiation device 2 may be configured so that plural light irradiation devices 2 are arrayed, or may include a cooling device for radiating heat generated by the light irradiation device 2.

(Light Irradiation Chamber)

Next, the light irradiation chamber 3 will be described.

The light irradiation chamber 3 is configured to have a metallic material such as aluminum (Al), iron (Fe), and stainless steel, a plastic material such as polyvinyl chloride (PVC) resin, an acrylic (PMMA: poly methyl methacrylate) resin, an ABS resin, a polycarbonate (PC) resin, a polypropylene (PP) resin, and a polyethylene (PE) resin, and a ceramic material such as alumina (Al2O3) and aluminum nitride (AlN). The light irradiation chamber 3 has a function of dividing the environment of the internal space 3a in the light irradiation chamber 3 and the outside environment.

The light irradiation chamber 3 of the present embodiment is formed in a substantially rectangular parallelepiped shape by means of conventionally known press working using aluminum (Al).

Then, an entrance 3c and an exit 3d are respectively formed on a pair of side surfaces 3b opposing in the light irradiation chamber 3 so that the target 4 can move with a light-irradiated surface up on which the ultraviolet ray curable ink 5 is applied, in the internal space 3a in the light irradiation chamber 3 in one direction. The entrance 3c and the exit 3d of the present embodiment are formed by performing press working on an aluminum (Al) plate.

A width and a height of the entrance 3c and the exit 3d may be respectively larger than a width and a thickness of the target 4 to which the ultraviolet ray curable ink 5 is applied. However, it is necessary to increase the width and the height to such an extent that the target 4 is not damaged by contacting the entrance 3c and the exit 3d when the target 4 passes through the entrance 3c and the exit 3d. Nevertheless, in order to divide the environment in the internal space 3a and the outside environment, it is preferable to adapt the width and the height to be close to the width and the thickness of the target 4 as much as possible. The width of the entrance 3c and the exit 3d of the light irradiation chamber 3 in the present embodiment is larger than the width of the target 4 by 15 mm each on one side, that is, larger by 30 mm in total. The height is larger than the thickness of the target 4 by 5 mm each on one side, that is, larger by 10 mm in total. The width of the target 4 is 250 mm, and the thickness thereof is 0.2 mm. The dimension of the entrance 3c and the exit 3d may be configured to be variable depending on the dimension of the target 4.

In the light irradiation apparatus 1 of the present embodiment, the above-described light irradiation device 2 is disposed in a substantially center portion of an upper section in the internal space 3a of the light irradiation chamber 3. Specifically, the light irradiation device 2 is bonded onto a surface of the internal space 3a side in an upper plate of the light irradiation chamber 3 which is located in the upper section of the internal space 3a of the light irradiation chamber 3 in the following manner (not illustrated) using a screw, solder, a metallic bonding material such as silver (Ag) solder, a resin-based adhesive of an epoxy resin and a silicone resin, an acrylic-based adhesive with respect to a base material such as polyester, non-woven fabric, acrylic foam, polyimide, polyvinyl chloride (PVC), and aluminum foil, a double-sided tape to which a rubber-based adhesive and a silicone-based adhesive are applied, or welding. An upper surface 3e of the internal space 3a in the present embodiment coincides with the surface of the internal space 3a side in the upper plate of the light irradiation chamber 3.

According to this configuration, the light irradiation apparatus 1 of the present embodiment can suppress leakage of the ultraviolet light from the inside of the light irradiation chamber 3 as much as possible, and can maintain an ambient temperature inside the light irradiation chamber 3 to be a constant temperature regardless of the outside environment. The reason why the ambient temperature inside the light irradiation chamber 3 can be maintained to be the constant temperature regardless of the outside environment is because as compared to a high pressure mercury lamp or a metal halide lamp, the ultraviolet light emitting element generates very little amount of heat, but the generated heat and the emitted ultraviolet ray heat the target 4 and the light irradiation chamber 3, and the ambience in the internal space 3a of the light irradiation chamber 3 is warmed by radiant heat of the target 4 and the light irradiation chamber 3.

It is empirically understood that if the temperature in the internal space 3a of the light irradiation chamber 3 is set to 35° C. or higher, it is possible to obtain surface free energy for the ultraviolet ray curable ink 5 suitable to improve adhesion between the ultraviolet ray curable ink 5 and the target 4. The reason of improving the adhesion is considered because the surface free energy of the ultraviolet ray curable ink 5 and the target 4 can be in a high state and wettability becomes excellent between the ultraviolet ray curable ink 5 and the target 4. Without disposing a separate heating device, the light irradiation apparatus 1 of the present embodiment can maintain the temperature in the internal space 3a of the light irradiation chamber 3 to be 35° C. or higher. That is, it is possible to maintain the temperature which allows the surface free energy suitable to improve the adhesion between the ultraviolet ray curable ink 5 applied to the target 4 and the target 4.

In addition, the surface free energy of the ultraviolet ray curable ink 5 is not determined by only the ambient temperature in which the ultraviolet ray curable ink 5 is placed, but also depends on a type of the ultraviolet ray curable ink 5, a material of the target 4, and a surface treatment state. However, by increasing the ambient temperature in which the ultraviolet ray curable ink 5 is placed, it is possible to obtain the surface free energy suitable to improve the adhesion between the ultraviolet ray curable ink 5 and the target 4.

Therefore, according to the light irradiation apparatus 1 of the present embodiment, the surface free energy of the ultraviolet ray curable ink 5 and the target 4 can be obtained in a state suitable to improve the adhesion between the ultraviolet ray curable ink 5 and the target 4. Accordingly, regardless of the service environment of the light irradiation apparatus 1 and types of the ultraviolet ray curable ink 5 and the target 4 to which the ultraviolet ray curable ink 5 is applied, it is possible to provide the light irradiation apparatus 1 which can realize strong adhesion between the ultraviolet ray curable ink 5 and the target 4 to which the ultraviolet ray curable ink 5 is applied.

(Embodiment of Printing Apparatus)

Figure 4:
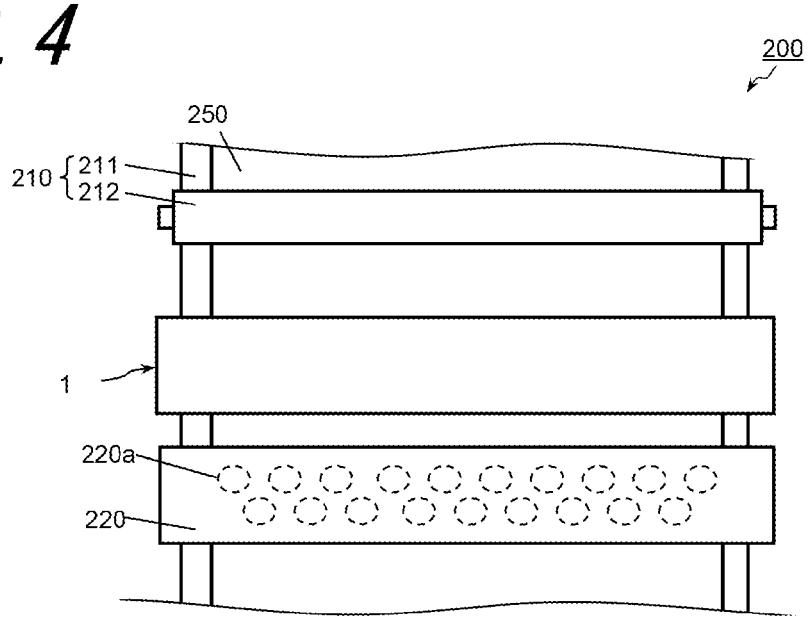
FIG. 4 is a top view illustrating an example of an embodiment of a printing apparatus using the light irradiation apparatus illustrated in FIG. 1.
Figure 5:
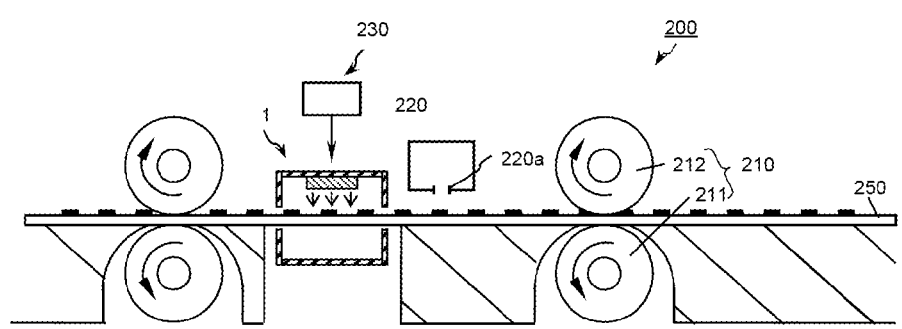
FIG. 5 is a side view of the printing apparatus illustrated in FIG. 4.

A printing apparatus 200 illustrated in FIGS. 4 and 5 will be described as an example of an embodiment of a printing apparatus according to the invention. This printing apparatus 200 includes a conveyance mechanism 210 for conveying a recording medium 250, an ink jet head 220 serving as a printing mechanism for performing printing on the conveyed recording medium 250, the above-described light irradiation apparatus 1 which emits the ultraviolet light to the printed recording medium 250, and a control mechanism 230 which controls light irradiation of the light irradiation apparatus 1. The recording medium 250 is equivalent to the above-described target 4.

The conveyance mechanism 210 conveys the recording medium 250 so as to pass by the ink jet head 220 and the light irradiation apparatus 1 in this order, and includes a placement table 211 and a pair of conveying rollers 212 which are disposed to oppose each other and are rotatably supported. The recording medium 250 supported by the placement table 211 is fed to a portion between the pair of conveying rollers 212. The recording medium 250 is fed in a conveyance direction by rotating the conveying rollers 212.

The ink jet head 220 has a function of adhering a photosensitive material to the recording medium 250 conveyed via the conveyance mechanism 210. This ink jet head 220 is configured to applying the photosensitive material to the recording medium 250 by ejecting a liquid droplet containing the photosensitive material onto the recording medium 250.

The present embodiment employs the ultraviolet ray curable ink 5 as the photosensitive material. In addition to the ultraviolet ray curable ink 5, the photosensitive material includes a photosensitive resist or a light curable resin.

The present embodiment employs a line-type ink jet head as the ink jet head 220. This ink jet head 220 has plural ejecting holes 220a arrayed in a line shape, and is configured to eject the ultraviolet ray curable ink 5 through the ejecting holes 220a. The ink jet head 220 performs the printing on the recording medium by ejecting the ink through the ejecting holes 220a onto the recording medium 250 conveyed in a direction orthogonal to an array of the ejecting holes 220a and applying the ink to the recording medium.

In the present embodiment, the line-type ink jet head is described as a printing mechanism, but the present embodiment is not limited thereto. For example, a serial-type ink jet head may be employed, or a line-type ejecting head or a serial-type ejecting head may also be employed. Furthermore, as the printing mechanism, an electrostatic head which accumulates static electricity in the recording medium 250 and adheres the photosensitive material to the recording medium 250 by using the static electricity may also be employed, or a liquid immersion device which immerses the recording medium 250 in a liquefied photosensitive material and adheres the photosensitive material to the recording medium 250 may also be employed. Furthermore, as the printing mechanism, a bristle, a brush, and a roller may also be employed.

The light irradiation apparatus 1 in the printing apparatus 200 has a function of exposing the photosensitive material adhering to the recording medium 250 conveyed via the conveyance mechanism 210 to the light. This light irradiation apparatus 1 is disposed on a downstream side in the conveyance direction with respect to the ink jet head 220. In addition, the light irradiation element 20 in the printing apparatus 200 has a function of exposing the photosensitive material adhering to the recording medium 250 to the light.

The control mechanism 230 has a function of controlling light irradiation of the light irradiation apparatus 1. A memory of this control mechanism 230 stores information indicating light characteristics which allow the ink droplet ejected through the ink jet head 220 to be relatively cured in an excellent condition. A specific example of the stored information includes a numerical value indicating wavelength distribution characteristics and light emitting intensity (light emitting intensity in each wavelength region) which are suitable to cure the ejected ink droplet. Since the printing apparatus 200 of the present embodiment has this control mechanism 230, it is possible to adjust a magnitude of a drive current input to the plural light emitting elements 20, based on the stored information of the control mechanism 230. For this reason, according to the printing apparatus 200 of the present embodiment, it is possible to emit the light using proper ultraviolet ray irradiation energy corresponding to the characteristics of the using ink. Therefore, it is possible to cure the ink droplet by using the light having relatively low energy.

In the printing apparatus 200, the conveyance mechanism 210 conveys the recording medium 250 in the conveyance direction. The ink jet head 220 ejects the ultraviolet ray curable ink 5 onto the conveyed recording medium 250, and causes the ultraviolet ray curable ink 5 to adhere to the surface of the recording medium 250. In this case, the ultraviolet ray curable ink 5 adhering to the recording medium 250 may be adhered over entire surface, may be partially adhered, or may be adhered with a desired pattern. The printing apparatus 200 cures the ultraviolet ray curable ink 5 by emitting the ultraviolet ray emitted from the light irradiation apparatus 1 to the ultraviolet ray curable ink 5 adhering to the recording medium 250.

According to the printing apparatus 200 of the present embodiment, the above-described advantageous effect included in the light irradiation apparatus 1 can be obtained.

Hitherto, a specific embodiment of the invention has been described as an example. However, without being limited thereto, the invention can be variously modified without departing from the scope of the invention.

Figure 6:
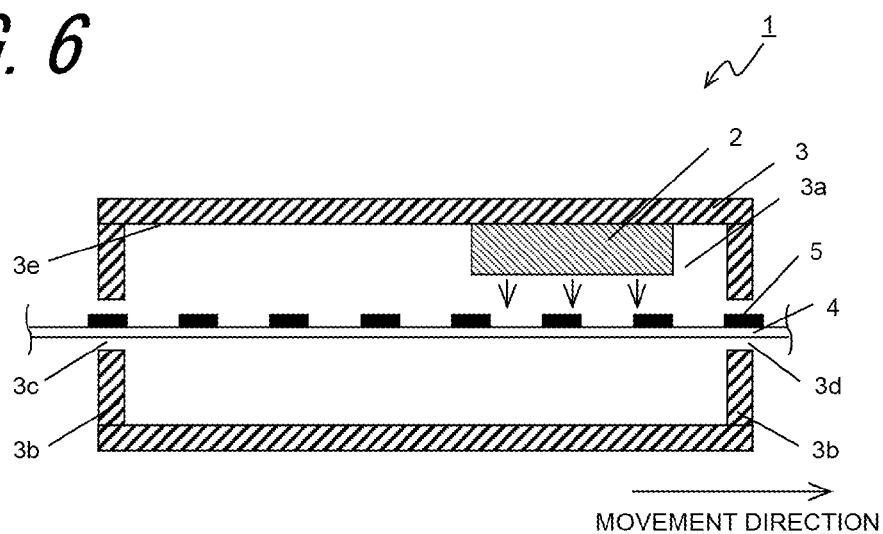
FIG. 6 is a cross-sectional view illustrating a first modified example of the light irradiation apparatus illustrated in FIG. 1.

For example, as in a first modified example illustrated in FIG. 6, the light irradiation device 2 may be disposed in the upper section and on the exit 3d side of the light irradiation chamber 3. According to this configuration, it is possible to lengthen a period from the time when the target 4 to which the ultraviolet ray curable ink 5 is applied passes through the entrance 3c of the light irradiation chamber 3 until the light irradiation device 2 emits the ultraviolet light to the target 4, that is, duration of stay in the internal space 3a of the target 4 until the ultraviolet light is emitted. Therefore, even when a conveying speed of the target 4 is fast, or even when the surface free energy of the ultraviolet ray curable ink 5 is low depending on a type of the ultraviolet ray curable ink 5, a material of the target 4, or a surface treatment state, it is possible to increase the surface free energy of the ultraviolet ray curable ink 5 and the target 4 during a period from the time when the ultraviolet ray curable ink 5 is applied to the target 4 until the ultraviolet light is emitted by the light irradiation device 2. Accordingly, it is possible to realize the strong adhesion between the ultraviolet ray curable ink 5 and the target 4.

Figure 7:
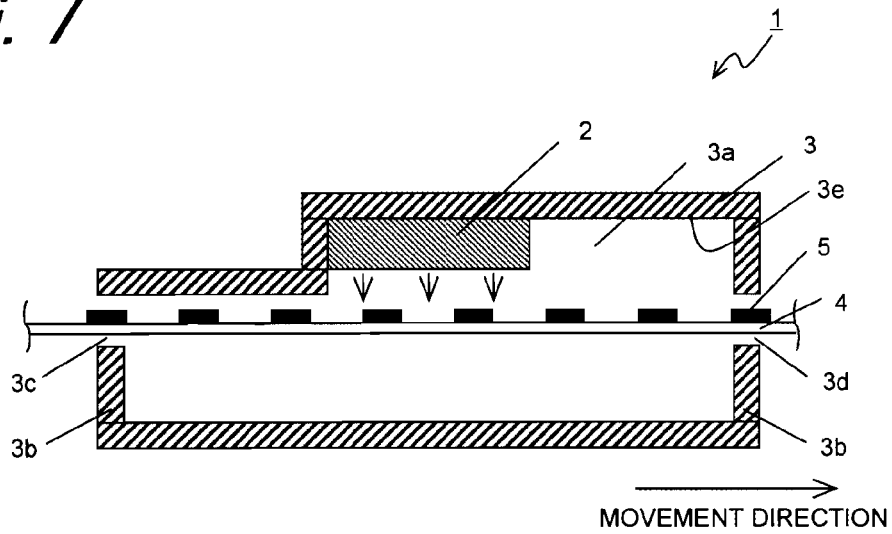
FIG. 7 is a cross-sectional view illustrating a second modified example of the light irradiation apparatus illustrated in FIG. 1.

In addition, as in a second modified example illustrated in FIG. 7, a distance between the light irradiated surface of the target 4 on which the ultraviolet ray curable ink 5 is applied and the upper surface 3e in the internal space 3a of the light irradiation chamber 3 may be shorter than a distance between the light irradiation device 2 and the light-irradiated surface on the entrance 3c side. According to this configuration, the radiant heat from the light irradiation chamber 3 is likely to be transferred to the ultraviolet ray curable ink 5 applied to the target 4 and the target 4. In addition, it is possible to decrease the volume of the internal space 3a of the light irradiation chamber 3. Accordingly, it is possible to increase the ambient temperature inside the internal space 3a. Therefore, it is possible to further increase the surface free energy of the ultraviolet ray curable ink 5 and the target 4, and thus, it is possible to realize the strong adhesion between the ultraviolet ray curable ink 5 and the target 4. Without being limited to the upper surface 3e, a distance between a lower surface 3f opposing the upper surface 3e and a surface opposite to the light-irradiated surface of the target 4, or a distance between the upper surface 3e and the light-irradiated surface on the exit 3d side may be shorter than a distance between the light irradiation device 2 and the light-irradiated surface. According to this configuration, it is possible to decrease the volume of the internal space 3a of the light irradiation chamber 3. Therefore, it is possible to increase the temperature in the internal space 3a. Furthermore, the radiant heat from the lower surface 3f of the light irradiation chamber 3 or the upper surface 3e located on the exit 3d side is transferred to the ultraviolet ray curable ink 5 through the target 4 before the ultraviolet light of the entrance 3c side is emitted. In this manner, it is possible to increase the surface free energy of the ultraviolet ray curable ink 5 and the target 4, and thus, it is possible to realize the strong adhesion between the ultraviolet ray curable ink 5 and the target 4.

Figure 8:
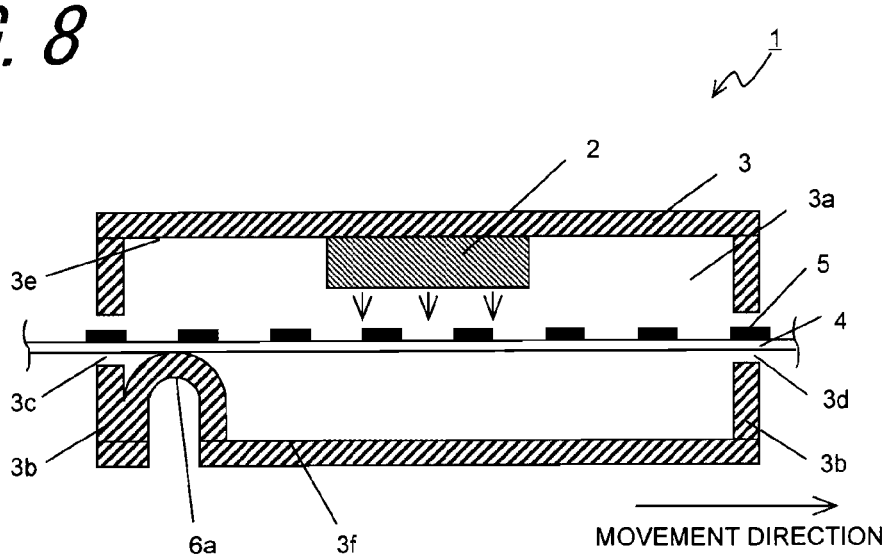
FIG. 8 is a cross-sectional view illustrating a third modified example of the light irradiation apparatus illustrated in FIG. 1.

Furthermore, as in a third modified example illustrated in FIG. 8, an entrance side convex portion 6a which contacts with a surface opposite to the light-irradiated surface of the target 4 which is a surface to which the ultraviolet ray curable ink 5 is applied may be disposed on the entrance 3c side of the lower surface 3f in the internal space 3a. According to this configuration, the heat of the light irradiation chamber 3 is directly transferred to the target 4 via the entrance side convex portion 6a. Therefore, it is possible to efficiently increase the surface free energy of the ultraviolet ray curable ink 5 applied to the target 4 and the target 4. Accordingly, it is possible to realize the strong adhesion between the target 4 and the ultraviolet ray curable ink 5.

In the entrance side convex portion 6a of the third modified example, a lower plate of the light irradiation chamber 3 which is located on the lower surface 3f in the internal space 3a of the light irradiation chamber 3 is formed by means of conventionally known press working. In addition to this press working, the entrance side convex portion 6a may be separately prepared and bonded to the lower plate of the light irradiation chamber 3 by being screwed, by using a metallic bonding material such as solder, silver (Ag) solder, a resin-based adhesive of an epoxy resin and a silicone resin, a double-sided tape to which an acrylic-based adhesive, a rubber-based adhesive and a silicone-based adhesive are applied with respect to a base material such as polyester, non-woven fabric, acrylic foam, polyimide, polyvinyl chloride (PVC), and aluminum foil, or by welding. In addition, any shape of the entrance side convex portion 6a may be employed as long as the shape is unlikely to damage the target 4 and facilitates heat transfer to the target 4. The plural entrance side convex portions 6a may be provided.

Figure 9:
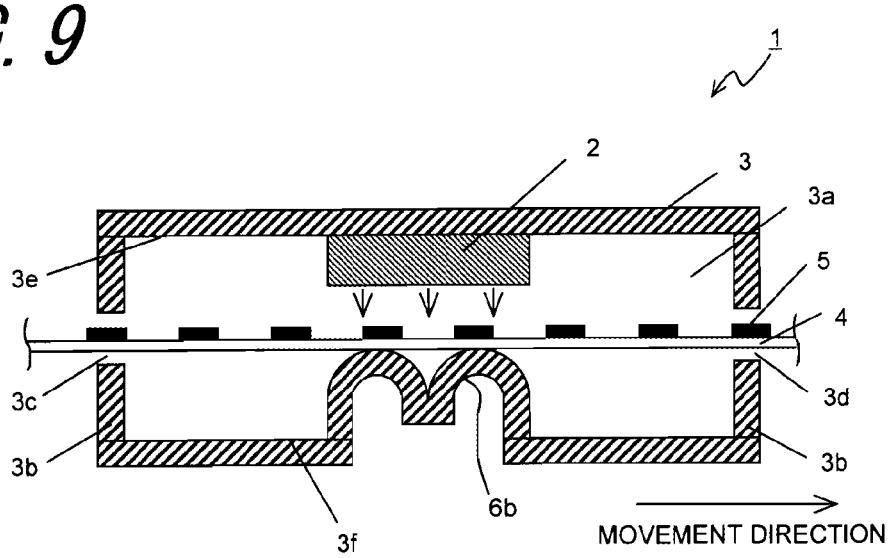
FIG. 9 is a cross-sectional view illustrating a fourth modified example of the light irradiation apparatus illustrated in FIG. 1.

In addition, as in a fourth modified example illustrated in FIG. 9, an exit side convex portion 6b which contacts with a surface opposite to the light-irradiated surface of the target 4 which is a surface to which the ultraviolet ray curable ink 5 is applied may be disposed at a position corresponding to the light irradiation device 2 of the lower surface 3f in the internal space 3a. The exit side convex portion 6b is disposed at the position corresponding to the light irradiation device 2. Therefore, it is possible to efficiently transfer the heat from the target 4 heated by the emitted ultraviolet light to the light irradiation chamber 3 via the exit side convex portion 6b. Accordingly, it is possible to increase the radiant heat from the light irradiation chamber 3, and thus, it is possible to efficiently increase the surface free energy of the ultraviolet ray curable ink 5 applied to the target 4 and the target 4. Therefore, it is possible to realize the strong adhesion between the target 4 and the ultraviolet ray curable ink 5. Without being limited to the position corresponding to the light irradiation device 2, the exit side convex portion 6b may be disposed on the further exit 3d side from the position corresponding to the light irradiation device 2. This is because as long as the exit side convex portion 6b is disposed between the position corresponding to the light irradiation device 2 and the exit 3d, the heat generated by the emitted ultraviolet light and obtained by the target 4 can be transferred to the light irradiation chamber 3.

Figure 10:
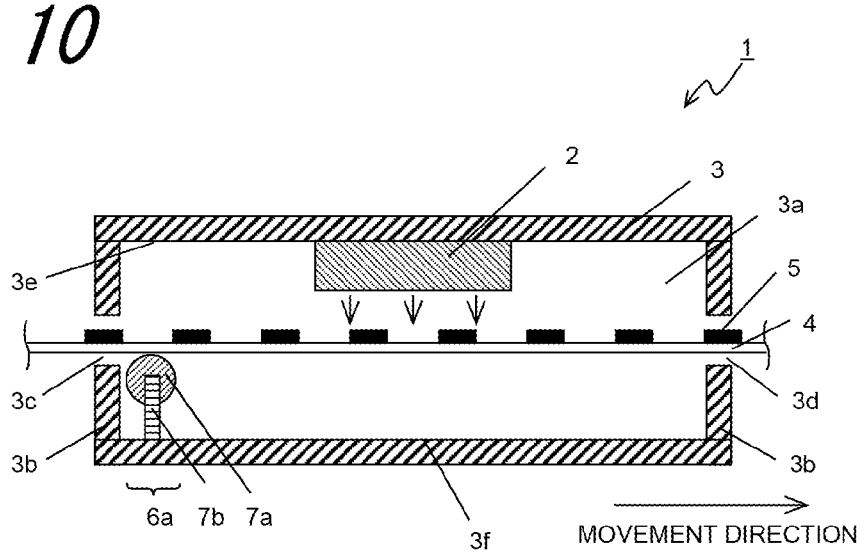
FIG. 10 is a cross-sectional view illustrating a fifth modified example of the light irradiation apparatus illustrated in FIG. 1.

In addition, as in a fifth modified example illustrated in FIG. 10, the entrance side convex portion 6a may be configured by a roller 7a and a roller receiver 7b. The roller 7a is formed of a metallic material such as aluminum (Al), iron (Fe), and stainless steel, a resin material such as polyvinyl chloride (PVC) resin, an acrylic (MMA and PMMA) resin, an ABS resin, a polycarbonate (PC) resin, a polypropylene (PP) resin, a polyethylene (PE) resin, a silicone resin, and a fluorine resin, a ceramic material such as alumina ($Al_2O_3$) and aluminum nitride (AlN), or a rubber material such as silicone rubber, fluorine rubber and EPDA (Ethylene Propylene Diene Acryl) rubber. The roller receiver 7b may be formed of a heat conductive material, and may employ a material the same as that of the light irradiation chamber 3. According to this configuration, it is not only possible to efficiently transfer the heat of the light irradiation chamber 3 to the target 4, but also possible to suppress friction between the target 4 and the entrance side convex portion 6a. Therefore, it is possible to configure the target 4 so as to be unlikely to be damaged. Similar to the entrance side convex portion 6a, the exit side convex portion 6b may also be configured by the roller and the roller receiver.

Figure 11:
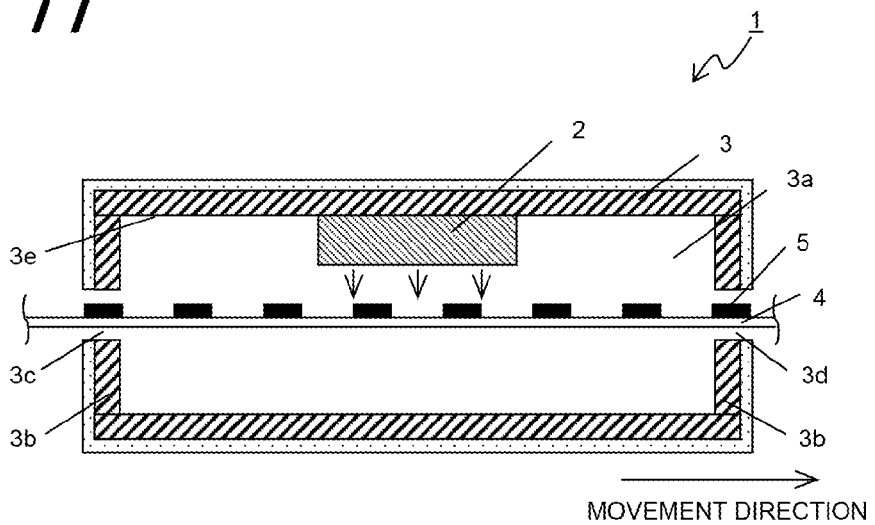
FIG. 11 is a cross-sectional view illustrating a sixth modified example of the light irradiation apparatus illustrated in FIG. 1.

Furthermore, as in a sixth modified example illustrated in FIG. 11, the light irradiation chamber 3 excluding the entrance 3c and the exit 3d may be covered with a heat insulation material whose thermal conductivity is 0.1 W/(m·K) or less. For example, as the heat insulation material, the light irradiation chamber 3 may be formed of fiber-based heat insulation material such as glass wool and rock wool, and foam-based heat insulation material such as urethane foam, phenolic foam, and polystyrene foam. According to this configuration, it is possible to allow the temperature in the internal space 3a of the light irradiation chamber 3 to be in a more stable state, and thus, it is possible to configure the target 4 so as to be further unlikely to receive the influence from the outside environment. Accordingly, it is possible to stably increase the surface free energy of the ultraviolet ray curable ink 5 applied to the target 4 and the target 4. Therefore, it is possible to realize the strong adhesion between the ultraviolet ray curable ink 5 and the target 4.

Figure 12:
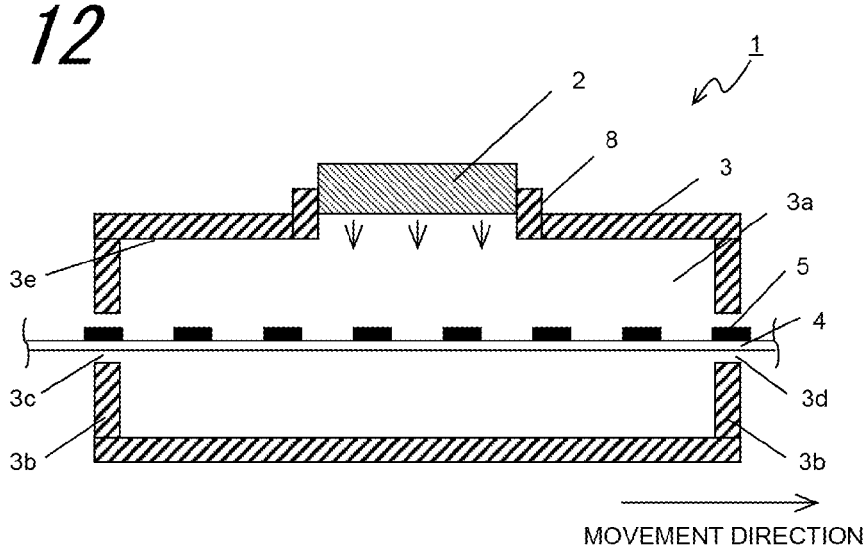
FIG. 12 is a cross-sectional view illustrating a seventh modified example of the light irradiation apparatus illustrated in FIG. 1.

The light irradiation device 2 of the present embodiment is disposed on the internal space 3a side of the upper plate in the light irradiation chamber 3. However, as in a seventh modified example illustrated in FIG. 12, the light irradiation device 2 may be disposed so as to protrude from the upper plate of the light irradiation chamber 3 by disposing a through-hole 8 corresponding to the light irradiation device 2 in the upper plate of the light irradiation chamber 3. In many cases, a heat sink and a heat radiating flow path pipe for cooling the electric wire or the light irradiation device are disposed in the light irradiation device 2. However, by adopting this configuration, it is possible to dispose these heat sink and heat radiating flow path pipe outside the light irradiation chamber 3. Therefore, it is possible to maintain the environment in the internal space 3a to be in a stable state. Furthermore, an advantageous effect can be obtained in that work efficiency is improved when maintenance work is carried out for the electric wire, the heat sink, and the heat radiating flow path pipe.

In addition, an example according to the embodiments of the printing apparatus 200 is not limited to the above-described examples. For example, the printing apparatus 200 may be a so-called offset printing-type printer in which a pivotally supported roller is rotated and a recording medium is conveyed along a surface of the roller. Even in this case, the same advantageous effect can be obtained.

In the present embodiment, an example has been described in which the light irradiation apparatus 1 is applied to the printing apparatus 200 using the ink jet head 220. However, this light irradiation apparatus 1 can also be applied in curing various types of light curable resin, for example, in a dedicated apparatus for curing the light curable resins which are subjected to spin coating on a target surface. In addition, for example, the light irradiation apparatus 1 may be used as a light irradiation source in an exposure apparatus.

Reference Signs List

1: Light irradiation apparatus
2: Light irradiation device
3: Light irradiation chamber
3a: Internal space
3b: Side surface
3c: Entrance
3d: Exit
3e: Upper surface
4: Target (Recording medium)
5: Ultraviolet ray curable ink
6a: Entrance side convex portion
6b: Exit side convex portion
7a: Roller
7b: Roller receiver
8: Through-hole
10: Base
11: One main surface
12: Opening portion
13: Connection pad
14: Inner peripheral surface
15: Bonding material
16: Optical lens
17: Lens adhesive
20: Light emitting element
21: Element substrate
22: Semiconductor layer
23, 24: Element electrode
30: Sealing material
40: Stacked body
41: First insulation layer
42: Second insulation layer
50: Electric wire
200: Printing apparatus
210: Conveyance mechanism
211: Placement table
212: Conveying roller
220: Ink jet head
220a: Ejecting hole
230: Control mechanism
250: Recording medium

The invention claimed is:

1. A light irradiation apparatus for emitting light including an ultraviolet ray to a target relatively moving in one direction, comprising:
    a light irradiation device in which a light emitting element is disposed on one main surface of a base; and
    a light irradiation chamber having an entrance and an exit and defining an internal space thereof, inside the internal space of the light irradiation chamber the target moving with a light-irradiated surface up from the entrance to the exit in the one direction, the light irradiation device being disposed in an upper section of the internal space of the light irradiation chamber,
    wherein the light irradiation chamber comprises a convex portion in a lower surface thereof, and the convex portion contacts with a surface opposite to the light-irradiated surface of the target when the target is moving inside the internal space of the light irradiation chamber.

2. The light irradiation apparatus according to claim 1, wherein the light irradiation device is disposed on a side of the exit of the light irradiation chamber.

3. The light irradiation apparatus according to claim 1, wherein a distance between the light-irradiated surface of the target and an upper surface of the light irradiation chamber which opposes the light-irradiated surface is shorter than a distance between the light irradiation device and the light-irradiated surface at least on a side of the entrance of the light irradiation chamber.

4. The light irradiation apparatus according to claim 1, wherein the light irradiation chamber comprises an exit side convex portion is at a position corresponding to the light irradiation device, and the exit side convex portion contacts with the surface opposite to the light-irradiated surface of the target when the target is moving inside the internal space of the light irradiation chamber.

5. The light irradiation apparatus according to claim 1, wherein the entrance side convex portion comprises a roller contacting with the target and a roller receiver supporting the roller.

6. The light irradiation apparatus according to claim 1, wherein the light irradiation chamber is covered with a heat insulation material whose thermal conductivity is 0.1 W/(m·K) or less except at least the entrance and the exit.

7. A printing apparatus, comprising:
a printing device configured to perform printing on a recording medium; and
the light irradiation apparatus according to claim 1, the light irradiation apparatus emitting light to the printed recording medium.

8. The light irradiation apparatus according to claim 4, wherein the exit side convex portion comprises a roller contacting with the target and a roller receiver supporting the roller.

9. The light irradiation apparatus according to claim 1, wherein the convex portion in a lower surface of the light irradiation chamber contacts with the surface opposite to the light-irradiated surface of the target when the target is moving inside the internal space of the light irradiation chamber, on a side of the entrance of the light irradiation chamber.

10. The light irradiation apparatus according to claim 1, wherein the convex portion comprises an entrance side convex portion on a side of the entrance of the light irradiation chamber, and the entrance side convex portion contacts with the surface opposite to the light-irradiated surface of the target when the target is moving inside the internal space of the light irradiation chamber.

* * * * *